United States Patent
Chang

[19]
[11] Patent Number: 6,082,623
[45] Date of Patent: Jul. 4, 2000

[54] COOLING SYSTEM AND METHOD FOR A PORTABLE COMPUTER

[75] Inventor: Yi-Shun Chang, Taipei, Taiwan

[73] Assignee: Twinhead International Corp., Taipei, Taiwan

[21] Appl. No.: 09/262,763

[22] Filed: Mar. 4, 1999

[51] Int. Cl.[7] ........................................................ F24F 7/00
[52] U.S. Cl. .................... 236/49.3; 62/259.2; 165/80.3
[58] Field of Search .................... 236/49.3; 165/80.2, 165/80.3; 62/259.2; 361/103, 106

[56] References Cited

U.S. PATENT DOCUMENTS

| | | | |
|---|---|---|---|
| 5,249,741 | 10/1993 | Bistline et al. | 236/49.3 |
| 5,590,061 | 12/1996 | Hollowell, II et al. | 364/571.03 |
| 5,848,282 | 12/1998 | Kang | 395/750.05 |
| 5,898,568 | 4/1999 | Cheng | 361/695 |
| 5,974,557 | 10/1999 | Thomas et al. | 713/322 |
| 6,014,611 | 1/2000 | Arai et al. | 702/132 |

*Primary Examiner*—Henry Bennett
*Assistant Examiner*—Marc Norman

*Attorney, Agent, or Firm*—Baker Botts L.L.P.

[57] ABSTRACT

A cooling system and method is provided to automatically switch a Central Processing Unit (CPU) to a proper execution mode according to a current working temperature and a current air flow value. The housing of the portable computer has a ventilation inlet and a ventilation outlet. A table is built and stored in a memory for recording a flow value and its correspondent target execution mode for various working temperatures. A thermal sensor detects a current working temperature and sends the result to a microprocessor. A pressure sensor detects a flow value by sensing air flow passing through the ventilation inlet and outlet and generating a heat dissipation signal representing the current air flow value. The microprocessor then uses the current air flow value to look up the table to find out a target execution mode according to the current working temperature and the current air flow value. After obtaining the target execution mode, the microprocessor will send a control signal to switch the CPU execution mode to the target execution mode. Accordingly, the present invention can prevent the CPU from overheating and still can optimize system performance according to the current working temperature.

20 Claims, 4 Drawing Sheets

6,082,623

COOLING SYSTEM AND METHOD FOR A PORTABLE COMPUTER

BACKGROUND OF THE INVENTION

A. Field of the Invention

The present invention relates to a cooling system and method for a portable computer. More particularly, it is a cooling system and method which can automatically switch a Central Processing Unit (hereinafter referred to as CPU) to a proper execution mode according to a current working temperature and an air flow value, thereby to prevent the CPU from overheating.

B. Description of the Prior Art

High speed CPU, such as Pentium CPU, requires special cooling devices for heat dissipation and heat absorption, such as cooling plate, cooling fans, and cooling fins, etc. However, the heat dissipation functions of these devices are very limited for a portable computer mainly due to the size of the compact housing. To fit into the compact housing, the cooling fan must be made smaller and thinner than an ordinary one used in a desktop computer. Consequently, the fan is not powerful enough to efficiently dissipate the heat generated by the CPU. The situation is the same when using cooling plate and cooling fins of smaller sizes.

Moreover, the housing of a portable computer is so compact that it barely leaves room for heat dissipation. For the concern of damages caused by overheating, some portable computers use thermal sensors for detecting a working temperature inside the housing. When the thermal sensor detects that the temperature is rising up abnormally, then it will slow down the system performance by adjusting the working frequency and voltage of the system to a lower execution mode of low heat generation state in order to cool down the CPU. In contrast, in an air-conditioned room or a room of good ventilation where the working temperature is usually below a normal working temperature, then the system can be switched to a higher execution mode by increasing the working frequency and voltage of the system so that the system performance can be increased.

However, the temperature control is not only a matter of temperature detection and execution mode switching. It should also involve in the control over the ventilation system and CPU execution mode to reach a high efficiency of heat dissipation in case of serious overheating. According to the conventional technology, the system cannot respond to the temperature change instantly and directly because it cannot establish a connection between the ventilation system and the CPU and then enhancing air flow while switching the CPU to a lower execution mode and vice versa.

SUMMARY OF THE INVENTION

Accordingly, the primary object of the present invention is to provide a cooling method and system for a portable computer which can control a ventilation system in response to a current working temperature instantly and then switch a CPU to a proper execution mode, thereby to prevent the CPU from overheating and to optimize system performance.

It is another object of the invention to provide a cooling system and method for a portable computer which can efficiently improve the ventilation condition of a portable computer when a current air flow value is determined to be lower with a threshold value, thereby to prevent the CPU from overheating.

The method of the present invention preferably includes the steps of: (1) building a table for recording a flow value and its correspondent target execution mode according to various working temperatures; (2) detecting a flow value by sensing air flow passing through a ventilation inlet and a ventilation outlet and generating a heat dissipation signal representing the flow value; (3) using the flow value as an index to look up the table for finding a correspondent target execution mode; and (4) switching a Central Processing Unit of the portable computer to the target execution mode.

The cooling system for a portable computer according to the preferred embodiment of the present invention encompasses: a pressure sensor for detecting air flow passing through the ventilation inlet and outlet and then generating a heat dissipation signal representing the flow value; a memory means for storing a table which records a flow value and its correspondent target execution mode accordingly to various working temperatures; and a microprocessor coupled to the pressure sensor and the memory for looking up the table by using the flow value as an index to find a target execution mode and then switching the CPU to the target execution mode.

BRIEF DESCRIPTION OF THE DRAWINGS

These and other objects and advantages of the present invention will become apparent by reference to the following description and accompanying drawings wherein.

DETAILED DESCRIPTION OF THE PREFERRED EMBODIMENTS

A preferred embodiment of the invention is described below. This embodiment is merely exemplary. Those skilled in the art will appreciate that changes can be made to the disclosed embodiment without departing from the spirit and scope of the invention.

Figure 1:
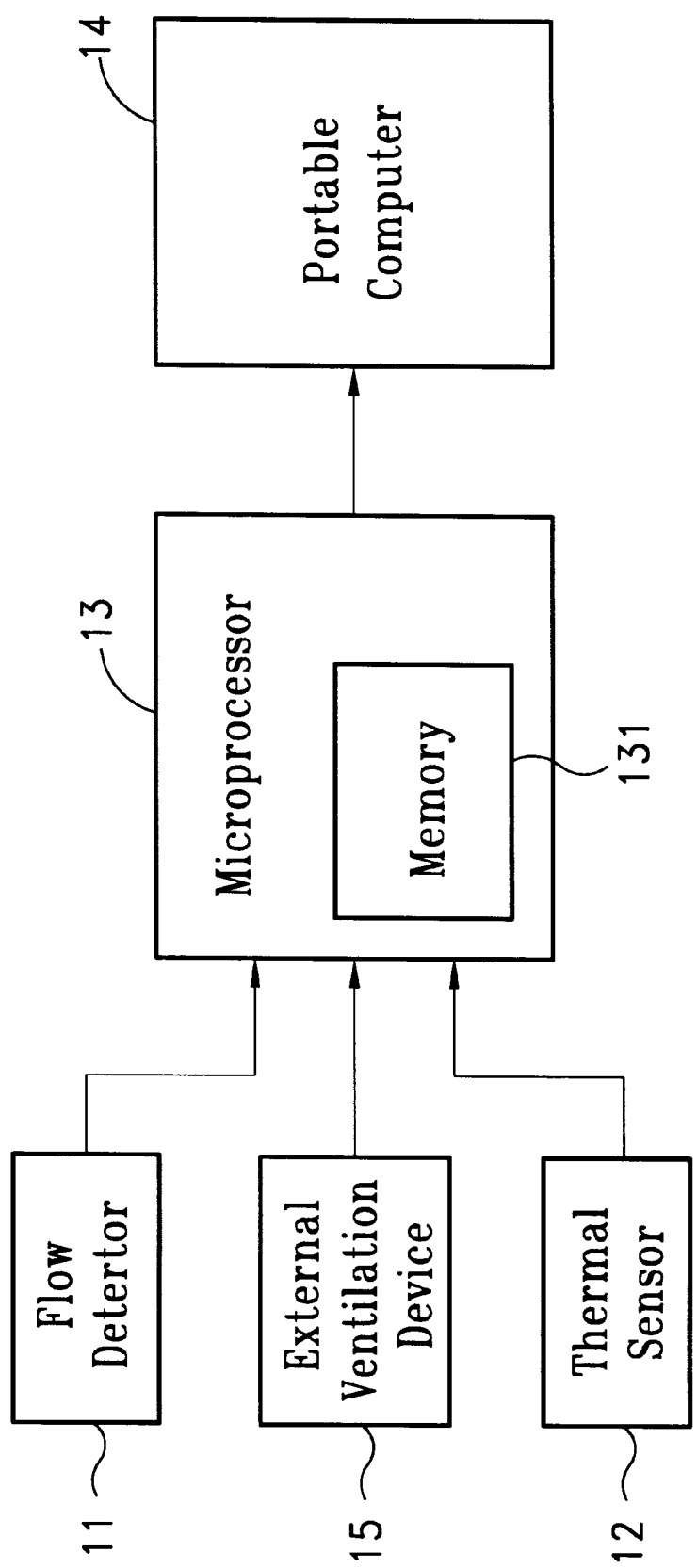
FIG. 1 is a block diagram showing the cooling system for a portable computer according to the preferred embodiment of the present invention.

Refer to FIG. 1, it shows an embodiment of the cooling system inside a portable computer 14 according to the preferred embodiment of the present invention. It includes a flow detector 11, a thermal sensor 12, an external cooling device 15, a microprocessor 13 with a memory 131. The total cooling effect is determined by the flow value (F) of the conductor (such as air flow) passing through the housing of portable computer 14. For this reason, the flow detector 11 detects the air flow value (F) passing through the portable computer 14 and then generates a heat dissipation signal indicating the result of the detection. The memory 131 inside the microprocessor 13 stores a flow-performance look-up table (not shown) for recording a flow value required for ventilation and its corresponding proper execution mode according to various working temperatures. The data entries of the flow-performance look-up table, including flow values, target execution modes, and temperatures, come from lab testing data collected by testing the performance of various models of portable computers and CPUs under various working temperatures.

The microprocessor 13 is electrically coupled to the flow detector 11, the thermal sensor 12, and the external ventilation device 15 to receives signals therefrom. The microprocessor 13 receives a heat dissipation signal input from the flow detector 11 for looking up the flow-performance look-up table stored in the memory 131. The heat dissipation signal represents a flow value. In response to the heat dissipation signal, the flow-performance look-up table will output a target execution mode to the microprocessor 13. In addition, the thermal sensor 12 detects the current working temperature of the portable computer 14 and then generates a signal representing a current working temperature T to the microprocessor 13. The external ventilation device 15 also sends a signal representing a threshold value (K) for a minimum requirement of ventilation in terms of the number of the external ventilation devices in use and their models. In response to the heat dissipation signal and the signal representing a current working temperature T, the operations of the microprocessor 13 are illustrated in FIG. 2.

Figure 2:
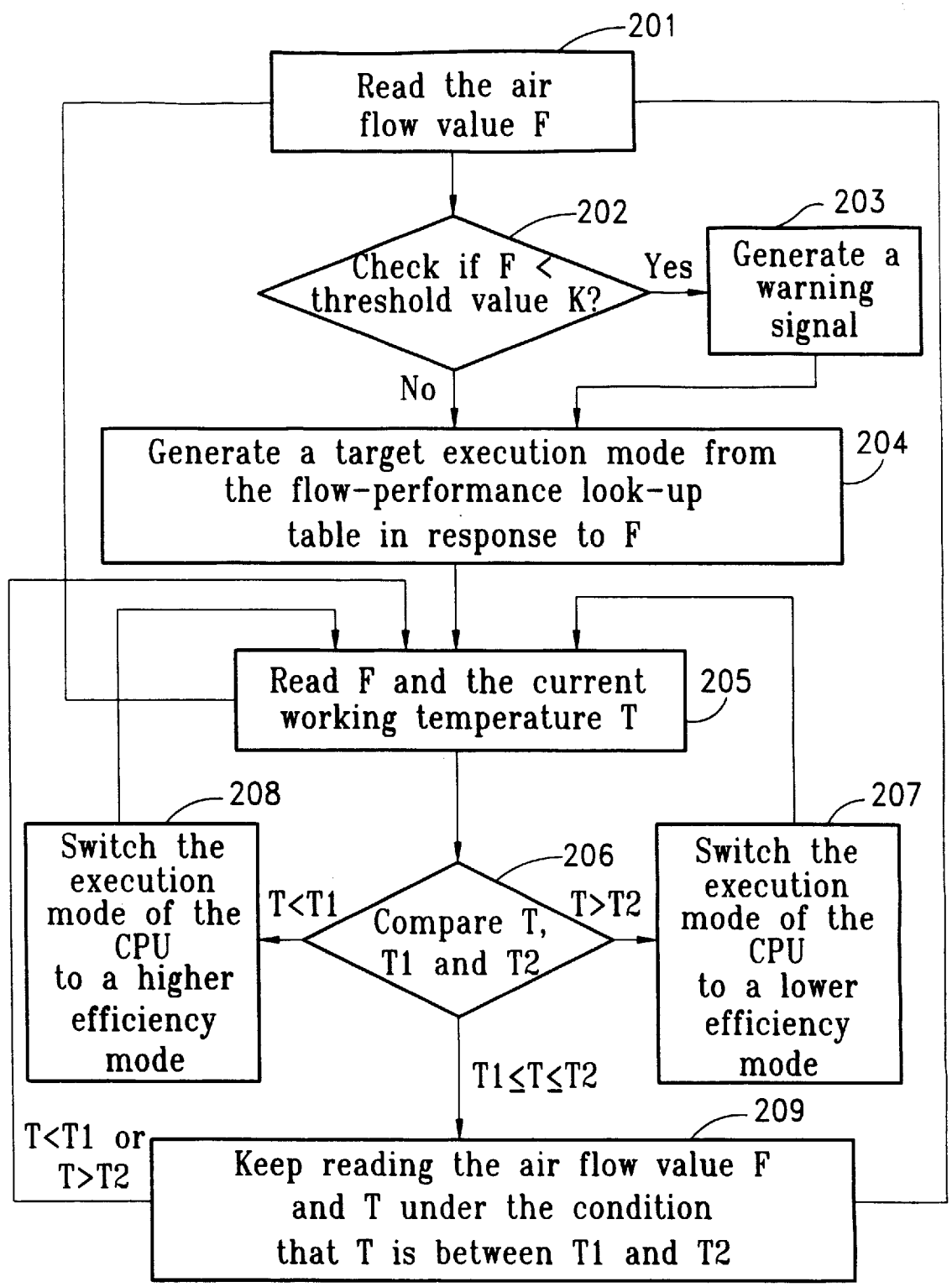
FIG. 2 is a control flow chart showing the determination steps of the microprocessor according to the method of the present invention.

Refer to FIG. 2 for the operation steps of the microprocessor 13:

Step 201: reading the heat dissipation signal (F) input from the flow detector.

Step 202: determining if the flow value represented by the heat dissipation signal (F) is smaller than the threshold value K? If yes, it indicates the current air flow is not enough for heat dissipation, so go to step 203. If not, go to step 204.

Step 203: enabling the portable compute to generate a warning signal for the user to handle the emergency situation.

Step 204: using the flow value (F) represented by the heat dissipation signal as an index to look up the flow-performance look-up table and output a target execution mode.

Step 205: reading the flow value (F) and the current working temperature T.

Step 206: Comparing the current working temperature T and a first predetermined temperature T1 and a second predetermined temperature T2 under the condition that the air flow value (F) remains stable. If the current working temperature T is smaller than the first predetermined temperature T1, then go to step 208. If the current working temperature T is larger than the second predetermined temperature T2, then go to step 207. If the current working temperature T is between the first predetermined temperature T1 and the second predetermined temperature T2, then go to step 209. The first predetermined temperature T1 and the second predetermined temperature T2 are set as a lower bound and the upper bound of a temperature range, respectively. Their actual values depend on practical application.

Step 207: since the current working temperature T exceeds the upper limit of the temperature, so switch the execution mode of the CPU to a lower efficiency mode; and go to step 205.

Step 208: since the current working temperature T is below the lower limit of the temperature, so switch the execution mode of the CPU to a higher efficiency mode to increase system performance; and then go to step 205.

Step 209: since the air flow and the current working temperature remains normal, so keep reading the values of the air flow (F) and the current working temperature T. When the value of the air flow value (F) is changed, go to step 201. When the current working temperature T is smaller than the first predetermined temperature T1 or larger than the second predetermined temperature T2, go to step 205.

Accordingly, the system can respond to the current working temperature instantly from constantly comparing the three values namely, the air flow value (F), the threshold value (K) and the current working temperature T. When the flow detector 11 detects that the heat dissipation ratio is under a threshold value, then the microprocessor 13 can automatically switch the CPU execution mode to a target execution mode to prevent the CPU from over heating. At the same time, the portable computer 14 will generate a warning signal to inform the user that the system heat dissipation ratio is abnormally low. It may indicate the malfunction of the external ventilation device. In such case, the user may check whether the external ventilation device is out of order or whether the ventilation inlet 32 or outlet 33 is stuck. Consequently, the overheating problem for the portable computer can be prevented in an earlier stage without deteriorating the system performance.

Figure 3:
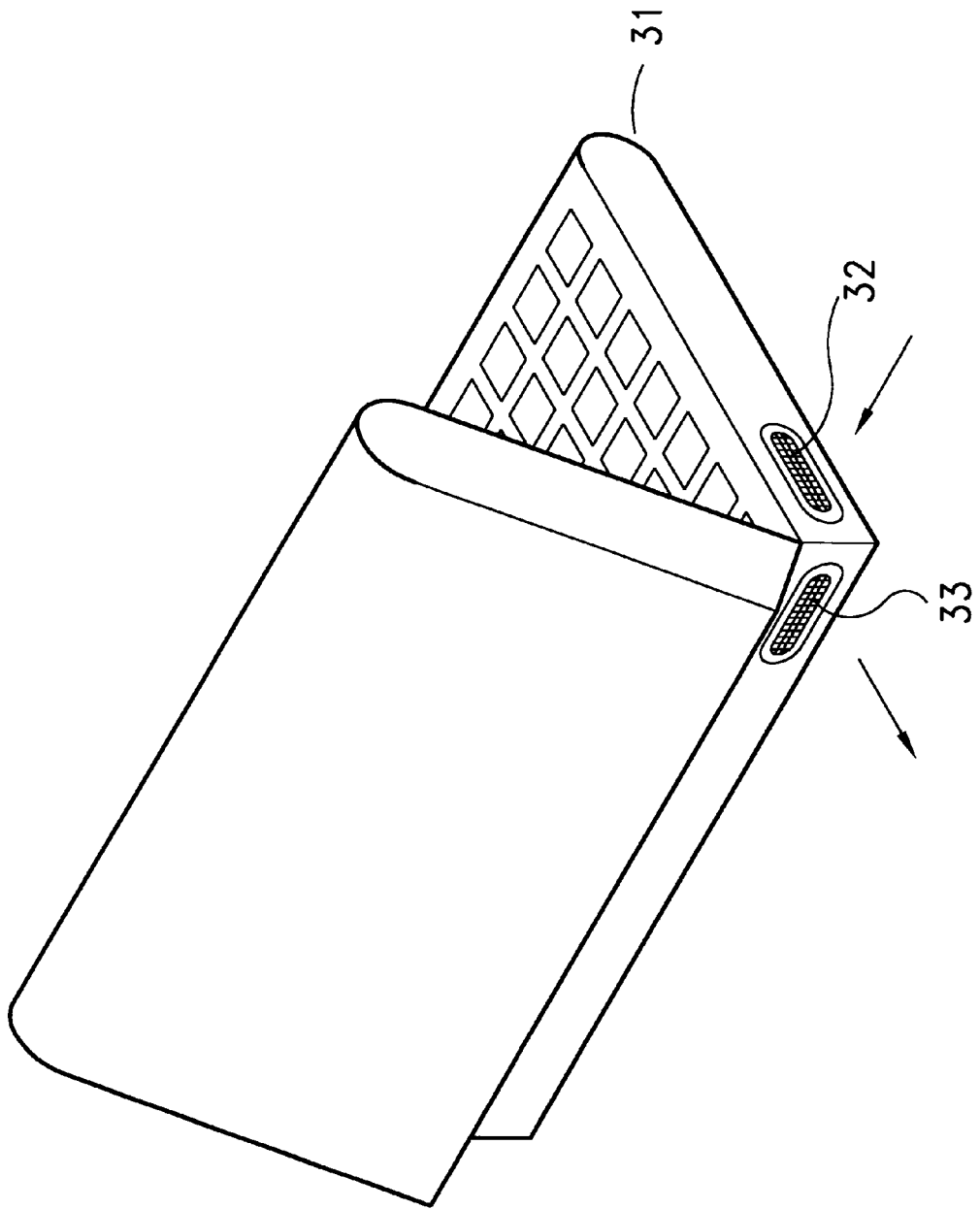
FIG. 3 is a schematic diagram showing the outlook of a portable computer having a ventilation inlet and an outlet.
Figure 4:
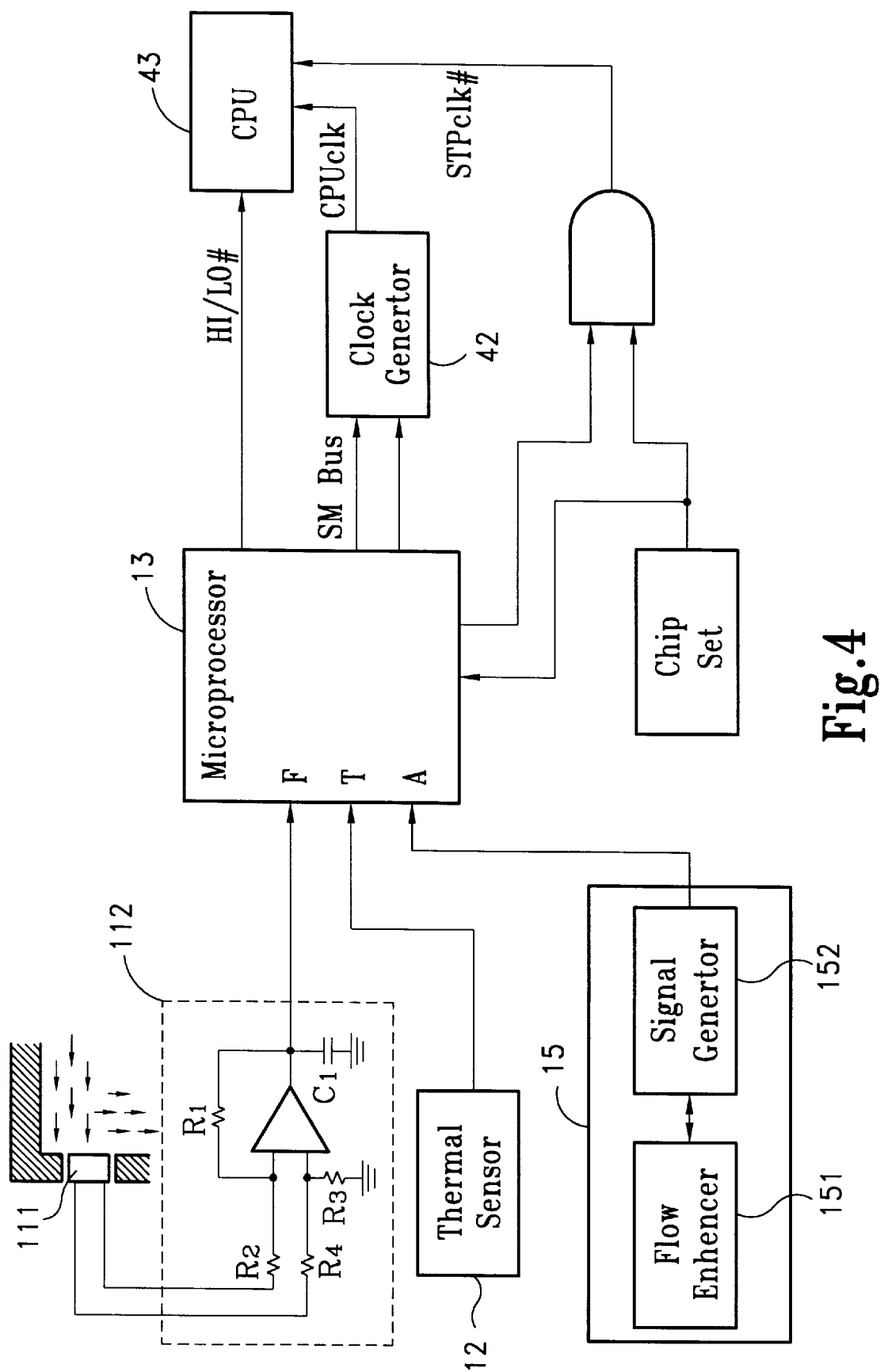
FIG. 4 is a block diagram showing the cooling system according to the preferred embodiment of the present invention.

Refer to FIG. 4 for showing the detailed embodiment of the present invention. The flow detector 11 as shown in FIG. 1 can be implemented using a pressure sensor 111 and a signal converter 112. The pressure sensor 111 can be implemented at the entrance of the ventilation inlet 31 and the ventilation outlet 32 of the portable computer 33 with reference also to FIG. 3. The pressure sensor 111 then generates multiple pressure signals in response to the pressure of the air flow passing through the ventilation inlet 31 and the ventilation outlet 32. The pressure sensor 111 can be implemented by the low pressure sensing chip available from EXAR Corporation, model SM5103. The signal converter 112 is coupled to the pressure sensor 111 for amplifying the pressure signals into heat dissipation signals. The output of the signal converter 112 is then forwarded to the microprocessor 13.

Moreover, the ventilation of the portable computer 33 can be further improved using an external ventilation device 15. The external ventilation device 15 comprises a flow enhancer 151 and a signal generator 152. The flow enhancer 151 may refer to, for instance, an external cooling fan or a compressor which is implemented externally close to the ventilation inlet 31 and outlet 32 of the portable computer 33 for enhancing the air flow passing through the ventilation inlet 32 and outlet 33. The external cooling fan or a compressor can also be integrated with external computer peripherals, such as an external CD-ROM drive, extending ports or an extending dock. Thus, the strength and speed of the air flow for ventilation can be greatly enhanced thereby to improve the cooling effect of the portable computer 33. The power of the external ventilation device 14 can be supplied from the portable computer 33. However, to allow a longer use of the portable computer battery, the external ventilation device 15 can also be provided with its own battery or adapted to an external power supply.

The signal generator 152 is to generate a threshold value (K) which represents the minimum air flow required for the portable computer at a normal working temperature. The threshold value is determined in terms of the total number of ventilation devices in use and their models. To get such information, a connection line must be established between the portable computer 33 and the external ventilation devices 14. Each of the ventilation devices can send a signal indicating its model number to the microprocessor 13. For instance, the external cooling fan will be assigned with a number 001 to identify its model. Another external cooling fan integrated with a CD-ROM drive will then be assigned with a number 002 to represent its model. The threshold value (K) can therefore be computed based on the number and models of the total ventilation devices in use, including internal ventilation and external ventilation devices.

The connection between the external ventilation devices and the portable computer can be established via electrical wires, wireless transmission, a mechanical switch, an electrical-magnetic sensor, or even a photosensor. The signals from the external ventilation devices are coupled to a predetermined pin of the microprocessor 13. Consequently, from the signals received, the microprocessor 13 can compute the optimal threshold value (K) which represents the minimum air flow required for the portable computer.

The execution mode of the CPU can be adjusted by the following ways: (1) Using the original Hi/Lo pin of the CPU 43 to control the speed of the CPU. (2) Changing the frequency of the clock cycles of the CPU 43 by controlling the clock generator 32 via the SM bus. However, it should be noted that the frequency modulation should follow the Phase Lock Look specification for different CPU models. (3) Using the original STPclk pin of the CPU to adjust the duty cycle of the internal clock cycles of the CPU. When the STPclk pin is at a low voltage, the internal clock cycles are stopped. In contrast, when the STPclk pin is at a high voltage, the internal clock cycles are normal. According to this mechanism, the duty cycle of the internal clock cycles of the CPU can be controlled, thereby to switch the CPU to a target execution mode.

From the preferred embodiment described above, the advantages of the present invention would be obvious to see. The invention allows a portable computer to react properly and instantly in response to a current working temperature even in an emergency situation. The inventive cooling system and method can also control external ventilation devices so that the ventilation condition can be efficiently improved. Moreover, by comparing the threshold value with the current air flow, the invention can prevent the system from overheating in an earlier stage. Consequently, the present invention can successfully achieve the objects stated above and solve the problems occurred in the prior arts.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A cooling method for a portable computer, said portable computer having a ventilation inlet and a ventilation outlet on its housing, comprising the steps of:
    building a table for recording a flow value and its correspondent target execution mode for a plurality of working temperatures;
    detecting a current flow value by sensing air flow passing through said ventilation inlet and said ventilation outlet and generating a heat dissipation signal representing said flow value;
    using said current flow value to look up said table and read out a correspondent target execution mode; and
    switching a Central Processing Unit execution mode to said target execution mode.

2. The method as claimed in claim 1, further comprising the steps of:
    switching said Central Processing Unit of said portable computer to a higher efficiency mode when said current flow value is stable and a current working temperature is lower than a first default temperature; and
    switching said Central Processing Unit of said portable computer to a lower efficiency mode when said current flow value is stable and said current working temperature is higher than a second default temperature.

3. The method as claimed in claim 1, further comprising the step of:
    generating a warning signal when said current flow value is larger than a threshold value of the minimum air flow required for said portable computer.

4. The method as claimed in claim 3, further comprising the steps of:
    enabling a plurality of ventilation devices for enhancing air flow passing through said ventilation inlet and said ventilation outlet.

5. The method as claimed in claim 3, wherein said threshold value is determined by computing a total number of ventilation devices in use, and the models thereof.

6. A cooling system for a portable computer, said portable computer having a ventilation inlet and a ventilation outlet on its housing, comprising:
    detecting means for generating a heat dissipation signal representing a current flow value by sensing air flow passing through said ventilation inlet and said ventilation outlet;
    memory means for storing a table which records a flow value and its correspondent target execution mode for a plurality of working temperatures; and
    a microprocessor coupled to said detecting means and said memory means for looking up said table by using said current air flow as an index to read out a target execution mode and for switching a Central Processing Unit execution mode to said target execution mode.

7. The system as claimed in claim 6, further comprising:
    thermal sensing means coupled to said microprocessor for detecting a current working temperature and generating a signal representing said current working temperature to said microprocessor, whereby
    when said current flow value is stable and said current working temperature is lower than a first default temperature, said Central Processing Unit is switched to a higher efficiency mode; and when said current flow value is stable and said current working temperature is higher than a second default temperature, said Central Processing Unit is switched to a lower efficiency mode.

8. The system as claimed in claim 6, wherein when said current flow value is smaller than a threshold value, said microprocessor generates a warning signal.

9. The system as claimed in claim 8, further comprising:
    external ventilation means coupled to said microprocessor for enhancing air flow passing through said ventilation inlet and said ventilation outlet when said current air flow is smaller than said threshold value.

10. The system as claimed in claim 8, wherein said threshold value is determined by computing a total number of ventilation devices in use, and the models thereof.

11. The system as claimed in claim 6, wherein said detecting means comprises:
    pressure sensing means for generating a plurality of signals responsive to said air flow passing through said ventilation inlet and said ventilation outlet; and
    converting means coupled to said pressure sensing means for amplifying and converting said plurality of signals to a plurality of heat dissipation signals.

12. The system as claimed in claim 6, wherein said Central Processing Unit has a plurality of execution modes in response to a plurality of working temperatures.

13. The system as claimed in claim 9, wherein said external ventilation means comprises:
    a signal generator coupled to said microprocessor for generating said threshold value; and flow enhancing means coupled to said signal generator for enhancing said air flow passing through said ventilation inlet and said ventilation outlet in response to said threshold value.

14. The system as claimed in claim 13, wherein said flow enhancing means is installed close to said ventilation inlet and said ventilation outlet.

15. The system as claimed in claim 9, wherein a power of said external ventilation means is supplied from said portable computer.

16. The system as claimed in claim 9, wherein a power of said external ventilation means is from its own battery.

17. A cooling system for a portable computer, said portable computer having a ventilation inlet and a ventilation outlet on its housing, comprising:

detecting means for generating a heat dissipation signal representing a current flow value by sensing air flow passing through said ventilation inlet and said ventilation outlet;

memory means for storing a table which records a flow value and its correspondent target execution mode for a plurality of working temperatures;

thermal sensing means for detecting a current working temperature and generating a signal representing said current working temperature;

external ventilation means for enhancing air flow passing through said ventilation inlet and said ventilation outlet and computing a threshold value representing the minimum air flow required; and a microprocessor coupled to said detecting means, said memory means, said thermal sensing means and said external ventilation means for looking up said table by using said current air flow as an index to read out a target execution mode and for switching a Central Processing Unit execution mode to said target execution mode.

18. The system as claimed in claim 17, wherein said detecting means comprises:

pressure sensing means for generating a plurality of signals responsive to said air flow passing through said ventilation inlet and said ventilation outlet; and converting means coupled to said pressure sensing means for amplifying and converting said plurality of signals to a plurality of heat dissipation signals.

19. The system as claimed in claim 17, wherein said Central Processing Unit is switched to a higher efficiency mode when said current flow value is stable and said current working temperature is lower than a first default temperature; and said Central Processing Unit is switched to a lower efficiency mode when said current flow value is stable and said current working temperature is higher than a second default temperature.

20. The system as claimed in claim 17, when said external ventilation means comprises:

a signal generator coupled to said microprocessor for generating said threshold value; and flow enhancing means coupled to said signal generator for enhancing said air flow passing through said ventilation inlet and said ventilation outlet in response to said threshold value.

* * * * *

UNITED STATES PATENT AND TRADEMARK OFFICE
CERTIFICATE OF CORRECTION

PATENT NO.   : 6,082,623
DATED        : July 4, 2000
INVENTOR(S)  : Chang

It is certified that error appears in the above-identified patent and that said Letters Patent is hereby corrected as shown below:

Title page,
Item [75], Inventors, "Taiwan," should read -- Taiwan, Republic of China --;

Item [73],
Assignee, "Taiwan," should read -- Taiwan, Republic of China --;

Column 6,
Line 4, "larger" should read -- smaller --.

Signed and Sealed this

Eighteenth Day of December, 2001

Attest:

JAMES E. ROGAN
Attesting Officer    Director of the United States Patent and Trademark Office